(12) United States Patent
Leonardi (10) Patent No.: US 6,798,037 B2
(45) Date of Patent: Sep. 28, 2004

(54) ISOLATION TRENCH STRUCTURE FOR INTEGRATED DEVICES

(75) Inventor: Salvatore Leonardi, Aci S. Antonio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/853,833

(22) Filed: May 10, 2001

(65) Prior Publication Data

US 2002/0008299 A1 Jan. 24, 2002

(30) Foreign Application Priority Data

May 11, 2000 (IT) .................................... MI2000A1044

(51) Int. Cl.[7] .............................................. H01L 29/00
(52) U.S. Cl. ...................................... 257/507; 257/520
(58) Field of Search ................................ 257/501, 502, 257/506, 520, 507

(56) References Cited

U.S. PATENT DOCUMENTS 4,980,747 A * 12/1990 Hutter et al. ............... 257/513
5,557,135 A * 9/1996 Hashimoto .................. 257/307
5,665,633 A * 9/1997 Meyer ........................ 438/427

OTHER PUBLICATIONS

The American Heritage® Dictionary of the English Language, Third Edition copyright © 1992 by Houghton Mifflin Company Electronic version licensed from INSO Corporation: further reproduction and distribution restricted in accordance with the Copyright Law.*

* cited by examiner

Primary Examiner—Nathan J. Flynn
Assistant Examiner—Leonardo Andújar
(74) Attorney, Agent, or Firm—Lisa K. Jorgenson; E. Russell Tarleton; Seed IP Law Group PLLC (57) ABSTRACT

An integrated device having a substrate wherein a buried layer and an epitaxial region have been formed, and an isolation structure adapted to define a plurality of isolation wells for integrating the components of the integrated device therein, the isolation structure including plural dielectrically insulated regions or dielectric trenches being filled with a conductive material to form a plurality of contact regions to buried regions of the device, the buried regions including, in particular, the substrate and buried layer.

14 Claims, 8 Drawing Sheets

ISOLATION TRENCH STRUCTURE FOR INTEGRATED DEVICES

TECHNICAL FIELD

The present invention relates to an integrated device having an isolation structure.

Specifically, the invention relates to an integrated device of a type that has a substrate, wherein a buried layer and an epitaxial region have been formed, and includes an isolation structure effectively defining a number of isolation wells for integrating the components of the integrated device therein. The invention also relates to a process for fabricating the above integrated device with an isolation structure.

BACKGROUND OF THE INVENTION

As is known, in most semiconductor-integrated devices, the integrated components are isolated electrically using a technique referred to as junction isolation.

Figure 1:
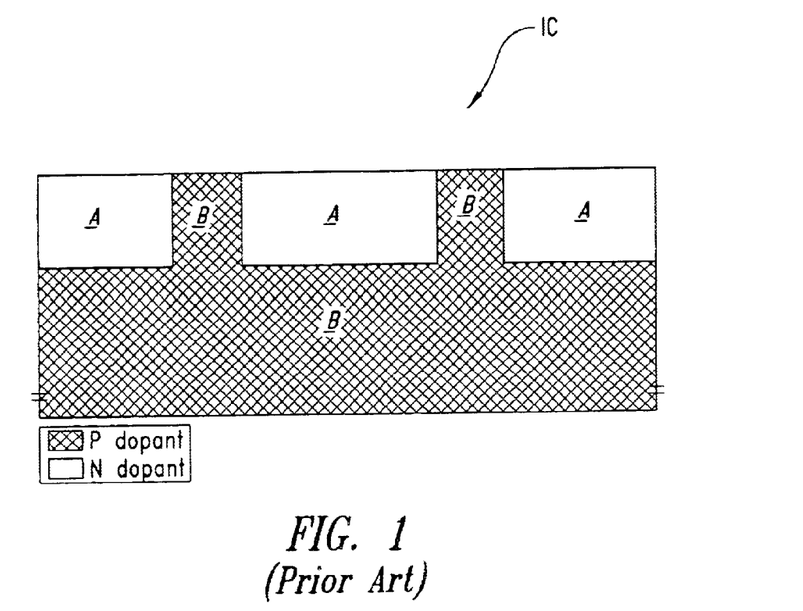
FIG. 1 is a schematic cross-sectional view of an integrated device with a junction type of isolation structure, according to the prior art.

FIG. 1 is a vertical cross-section showing schematically an integrated device IC with conventional isolation structures. In particular, that integrated device IC includes wells A, which are doped with a first dopant type (N-type, in this instance) and intended to receive components of various description. The components may be bipolar and/or MOS types, for example.

The wells A are bordered by an isolation region B, doped with a second dopant type (P-type, in this instance). Thus, the wells A are isolated electrically by reverse biasing the P-N junctions defined by the wells A and the isolation region B. This is known as "junction isolation".

The effectiveness of junction isolation depends on the kind of components integrated in the wells A, as well as on the kind of circuitry that comprises the integrated device IC.

It should be considered, however, that the reverse bias condition of the P-N junctions defined by the wells A and the isolation region B can not always be maintained through different circumstances of the integrated device operation. Also, capacitive and/or inductive effects, due either to the presence of several layers or the type of the bias applied, make the electrical isolation of the integrated components in the wells A by the junction isolation method uncertain.

Furthermore, the latter method uses up a large silicon area. In fact, the area occupied by an active component of a type whichever, integrated in a well A, is much smaller than that occupied by the isolation region B, the latter encompassing deep layers of considerable spread.

There are known basically two technologies for fabricating an integrated device with a conventional junction isolation structure.

Figure 2:
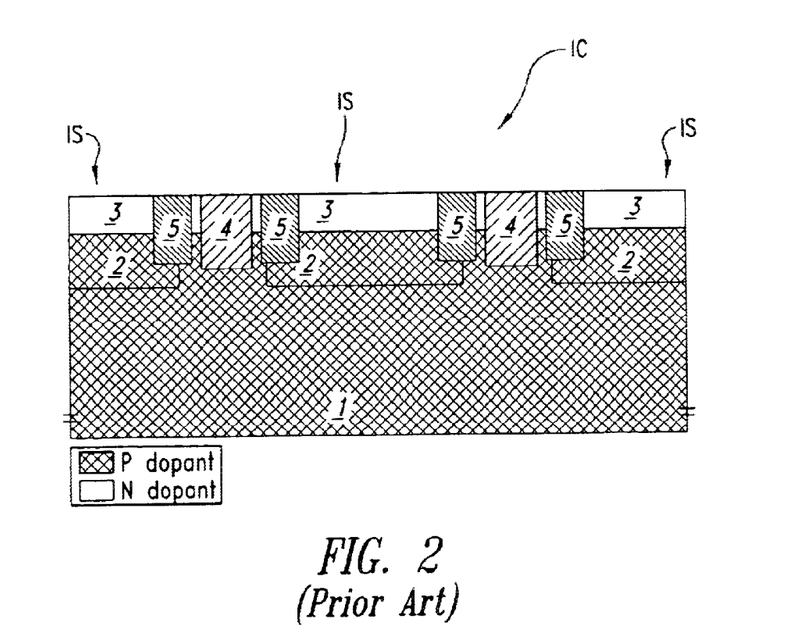
FIG. 2 is a schematic cross-sectional view of an integrated device with a junction type of isolation structure, as formed with a conventional low-power technology.

With a so-called low-power technology, shown schematically in FIG. 2, masking, implanting, and N-dopant diffusing steps are carried out on a P-type semiconductor material (substrate 1) to produce a buried layer 2 of the N$^+$ type. In particular, the buried layer 2 represents the collector or the drain region of an NPN bipolar or a VDMOS component, respectively.

An N-type epitaxial region 3 is then grown, which is followed by masking, implanting, and P-dopant diffusing steps carried out to produce isolation regions 4 effectively providing sidewall insulation for the isolation wells IS defined by the epitaxial region 3 and the buried layer 2.

Subsequent masking, implanting, and N-dopant diffusing steps produce sinker regions 5 at the ends of the buried layer 2. These sinker regions 5 establish contact between the surface of the integrated device IC and the buried layer 2.

Additional layers, such as P-well and N-well regions, active areas, etc., are then integrated in the N-type isolation wells IS bordered by P-doped regions, in particular the substrate 1 and isolation region 4, as required to complete different components.

Defining surface-enhancement regions and contact areas, and a metallizing and passivating step, close the process of fabricating the integrated device IC.

Figure 3:
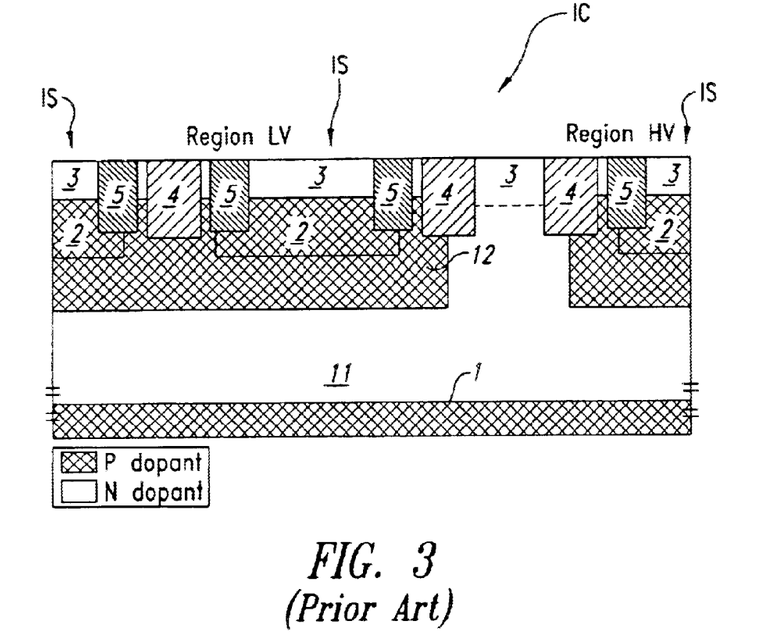
FIG. 3 is a schematic cross-sectional view of an integrated device with a junction type of isolation structure, as formed with a conventional ViPower technology.

With a VIPower technology, shown in FIG. 3, the vertical current flow power components, e.g., VIPower devices, comprise an N-type substrate.

The process sequence that leads to an integrated device IC being defined with junction isolation wells IS. starts with a semiconductor material 1 of the N$^+$ type and comprises an initial step of forming a first epitaxial region 11 of the N$^+$ type, followed by a masking, implanting, and P-dopant diffusing step to form a buried layer 12 of the isolation well.

In particular, the buried layer 12, additionally to providing part of the buried insulator for the drive circuitry or region LV, provides here part of the base region of the NPN power component or region IIV.

A subsequent masking, implanting, and N-dopant diffusing step, carried out at the buried layer 12, will bulk delimit the N-type regions 2 intended to contain various circuitry components, as described in connection with the prior art shown in FIG. 1.

The buried layer 12, besides providing the emitter for the NPN power component in the region HV, also functions as a buried collector and buried drain for the NPN and VDMOS signal components, respectively, in the region LV.

An additional epitaxial region 3 is necessary to provide N-type isolated wells IS, These wells are fully delimited with an additional masking, implanting, and P-type diffusing step to form the isolation regions 4 in the epitaxial region 3 and ensure electrical continuity to the buried region 12.

The isolation regions 4 are also part of the base of the NPN bipolar power component.

Once the isolation regions 4 are defined, a subsequent masking, implanting, and N-dopant diffusing step will provide the sinker regions 5 at the ends of the buried layer 2, thereby placing the surface of the integrated device IC in contact with the buried layer 2.

On completion of the above steps, other layers will be integrated in the N-type isolation wells IS comprising the buried layer 2 and the epitaxial region 3, to form various components, e.g., P-well and N-well regions, active areas, etc.

The fabrication of the integrated device IC is completed with the definition of surface enhancement regions, contact areas, and the associated metallizing and passivating step.

Note should be taken that the above conventional isolation well structures IS closely resemble each other. The only differences to be seen are in the substrate, of the P type or the N type, and the integration of the region 12 with VIPower technology.

SUMMARY OF THE INVENTION

The disclosed embodiments of the invention provide an integrated device with an isolation structure of the dielectric kind, which device has reduced area requirements and improved electrical isolation of the integrated components in the isolation wells, the space requirements of the isolation structure being also reduced, and the isolation structure suiting any (low- and high-voltage) semiconductor devices provided with isolation wells that have been formed by the junction isolation technique.

An integrated device with an isolation structure is provided that includes dielectric trench regions to ensure sidewall insulation of the components, which dielectric trench regions are filled with a conductive material in order to have the buried regions contacted from the surface.

In accordance with another aspect of the invention, an integrated device with an isolation structure is provided, including a substrate having a buried layer and an epitaxial region, the isolation structure adapted to define a plurality of isolation wells for integrating the components of the integrated device formed therein. The isolation structure includes plural dielectrically insulated trenches filled with a conductive material to form a plurality of contact regions to buried regions of the device, the buried regions including the substrate and the buried layer. Preferably, the dielectric trenches are formed at the edges of the isolation wells in contact with the buried layer. Ideally, the trenches each comprise thick dielectric regions surrounding a contact region.

In accordance with another aspect of the invention, a process for fabricating an integrated device having an isolation structure is provided that includes doping a substrate with a first dopant type; masking the substrate, implanting and defusing dopant of a second type to form a buried layer; and growing an epitaxial region doped with the dopant of the second type that includes forming a plurality of trenches and filling the trenches with a conductive material to form a plurality of contact regions to the buried regions of the device. Ideally, forming the plurality of trenches includes oxidizing the epitaxial region and depositing a layer of silicon nitride; depositing photoresist, exposing and developing the photoresist, sequentially etching the nitride and thermal oxide away from regions uncovered with the photoresist, and removing the photoresist; dry etching the silicon underneath as far down as the buried region; and oxidizing the trench sidewalls.

BRIEF DESCRIPTION OF THE DRAWINGS

The features and advantages of the integrated device with an isolation structure, according to this invention, will be apparent from the following description of embodiments thereof, given by way of non-limitative examples with reference to the accompanying drawings, wherein.

DETAILED DESCRIPTION OF THE INVENTION

Figure 4:
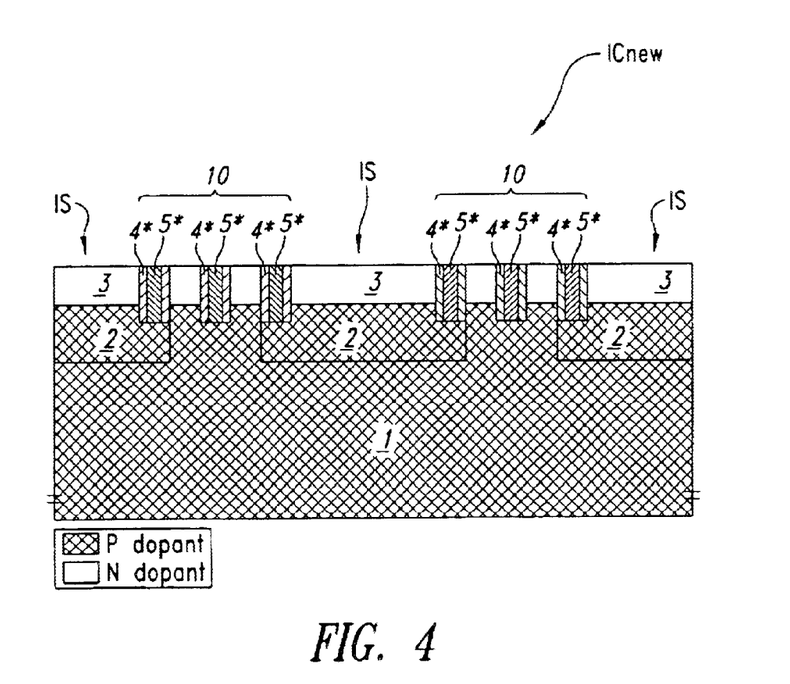
FIG. 4 is a schematic cross-sectional view of an integrated device with a trench type of isolation structure, according to the invention.

With reference to the drawing views, in particular to FIG. 4, an integrated device with a trench type of isolation structure, according to the invention, is generally shown at ICnew in schematic form.

Similar as the state-of-art integrated devices described above, the integrated device ICnew comprises a substrate 1, wherein a buried layer 2 and an epitaxial region 3 have been formed.

The integrated device ICnew further comprises an isolation structure 10 effectively defining a plurality of isolation wells IS, in which the components of the integrated device ICnew are integrated.

Advantageously in this invention, said isolation structure 10 comprises a plurality of dielectrically isolated regions 4* by dielectric trenches, which regions are filled with suitably doped polysilicon or another conductive material to provide a plurality of contacting regions 5* effective to place the buried regions 1 and 2 in contact with the surface of the integrated device ICnew.

Advantageously in this invention, the dielectric trench regions 4* provide, in particular, sidewall insulation for the components, and the contacting regions 5* within the regions 4* establish contact between the surface of the integrated device ICnew and the buried regions 1 and 2. The regions 4* and 5* are formed at the edges of the isolation wells IS in contact with the buried layer 2 and formed in the areas included between wells IS which are contacting the substrate 1.

It should be further noted that a trench isolation structure according to the invention could be applied to all the structures and semiconductor devices that incorporate junction isolation structures.

Such a trench isolation structure 10 is advantageous on many counts. First, the sidewall insulator of the components is a dielectric rather than a junction type, which removes all of the parasitic effects of prior solutions mentioned above.

In addition, where the trench isolation structure 10 is provided, the overall bulk of the integrated device ICnew can be reduced significantly (by a factor of 2, at least), it being a recognized fact that in junction isolated devices, the area taken up by each elementary component is mostly devoted to the isolation region 4 and the sinker region 5, which regions are substituted in this invention with a plurality of filled trenches 4*, which are less bulky.

Additionally to greatly reducing the silicon area required, the dielectric trenches effectively improve the voltage acceptance of the isolation wells IS because of the dielectric having a much larger critical field than silicon.

The dielectric trenches 4* will also act as interfacing regions between several close wells or from edge regions, thereby enabling the device to serve a number of electrical functions without involving any special technological or circuit solutions.

Just as important is that, as explained hereinafter, the dielectric trenches bring about no increased cost over the isolation well provided by standard integration processes, since the masking, implanting and diffusing steps for the isolation regions 4 and the sinker regions 5 are omitted in the invention and replaced by a step of masking, silicon etching (trench-forming), oxidizing, and filling with a conductive material.

The process sequence for fabricating an integrated device with a filled-trench isolation structure according to the invention will now be described.

In particular, the process sequence includes integrating dielectric trenches, which are filled with a conductive material, e.g., suitably doped polysilicon, and ensure that the buried regions are contacted, additionally to providing electrical isolation for the wells.

Figure 5:
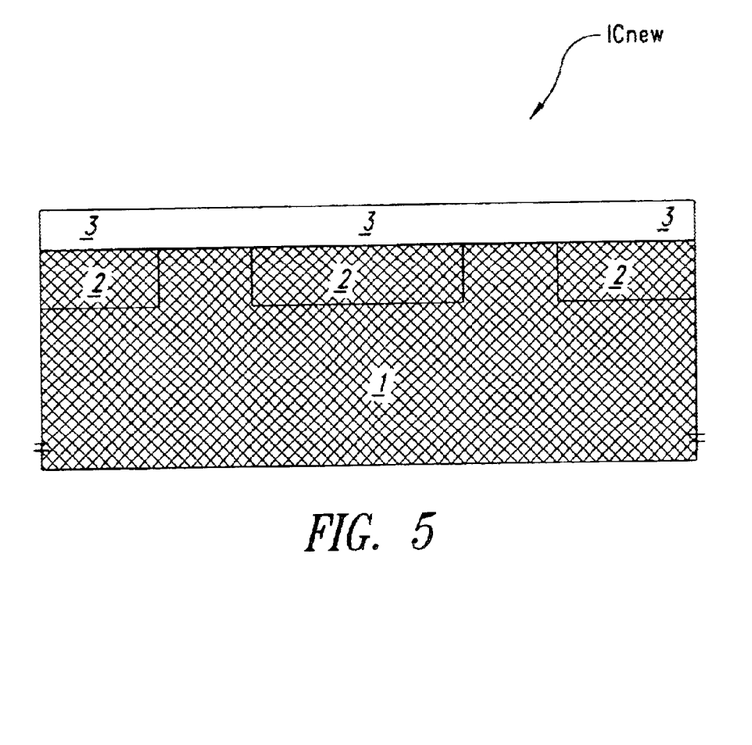
FIGS. 5 to 5e show successive process steps for fabricating the integrated device with a trench type of isolation structure, according to the invention.

Similar as in the aforementioned prior solutions, a step of masking, implanting, and N-dopant diffusing is carried out on a P-type semiconductor material or substrate 1 to produce a buried layer 2 of the $N^+$ type, and an N-type epitaxial region 3 is then grown, as shown schematically in FIG. 5.

Advantageously in this invention, oxidizing and depositing steps follow the completion of the epitaxial region 3. In particular, an oxidation 6 is formed to a few hundred Ångstroms, and a layer 7 of pyrolytic silicon nitride is deposited to a thickness of about 1000 Ångstroms.

Figure 5A:
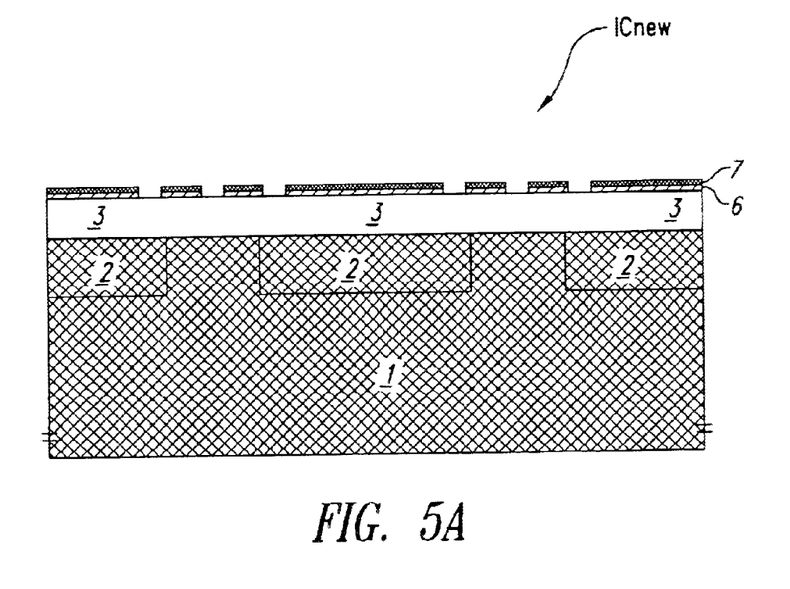

This is followed by a step of forming the trenches 4*. In a preferred embodiment of the invention, the trenches 4* are formed by a phototechnique that comprises the steps of depositing a photoresist, light-exposing and developing, sequentially etching the nitride and the thermal oxide away from the areas not covered with the photoresist, and removing the photoresist, as shown schematically in FIG. 5a.

Figure 5B:
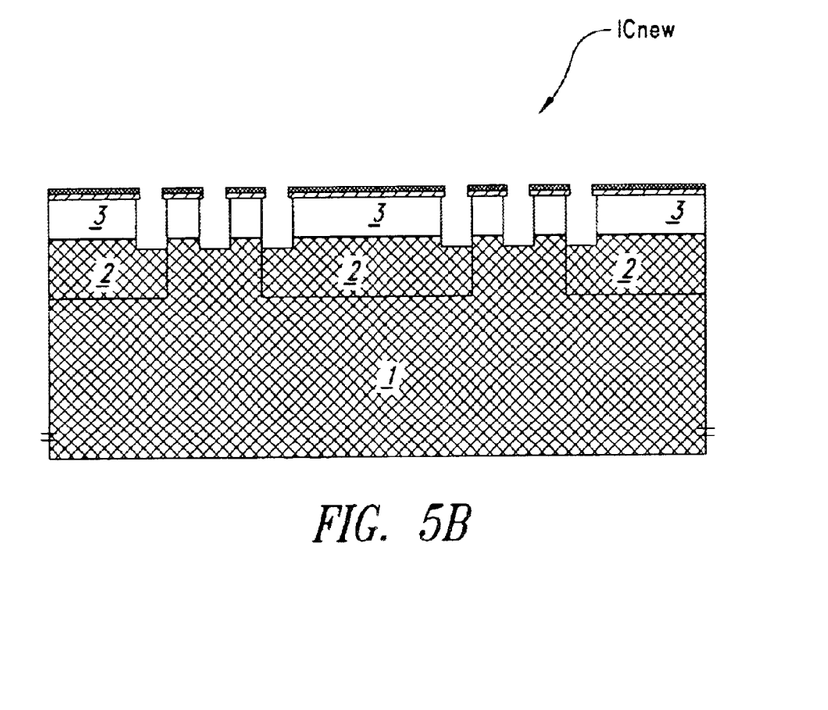

The trenches are then formed by dry etching the silicon underneath, as far down as the buried regions 1 and 2, as shown schematically in FIG. 5b.

The silicon surface etching is masked by the previously grown nitride, being itself masked by the photoresist, which had been deposited in application of the trench-forming phototechnique. After forming the trenches, their sidewalls are oxidized by an oxidizing step.

Figure 5C:
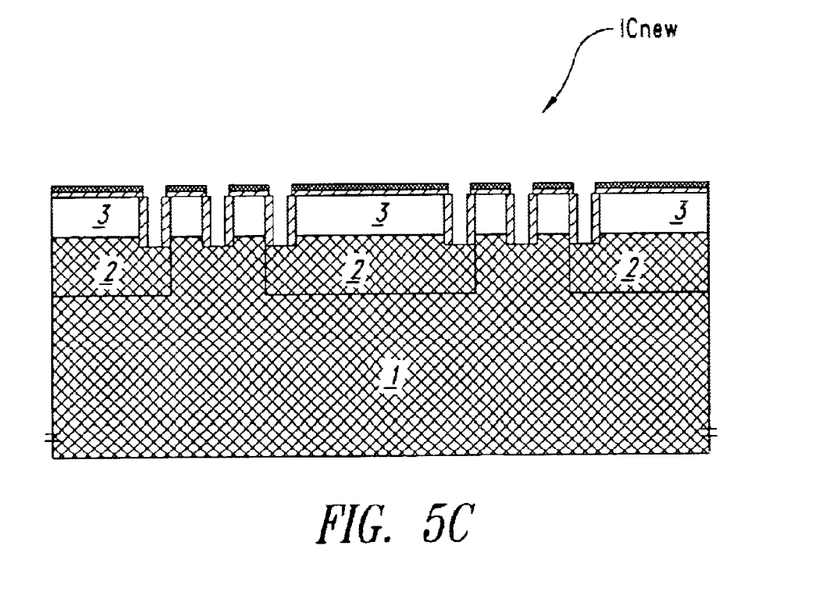

It should be noted that the oxide is grown on the trench sidewalls, not on the surface of the integrated device, because of the nitride present on that surface. The bottoms of the oxidized trenches are then pierced by dry etching, as shown schematically in FIG. 5c.

Figure 5D:
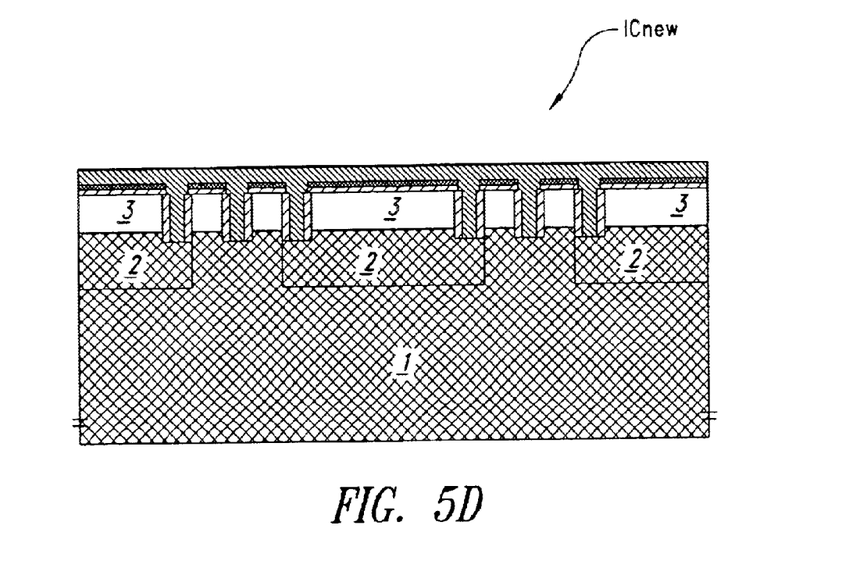

Advantageously in this invention, the trenches are now filled either with a conductive material or with polysilicon, by carrying out a depositing step over the entire surface, as shown schematically in FIG. 5d, so as to place the surface in contact with the buried regions 1 and 2.

When the filler selected is polysilicon, the polysilicon should be doped to lower its resistivity and provide resistive contacts to the buried regions 1 and 2.

The contacts can be improved by effecting a channeling implantation directly after the trench bottom is pierced.

It should be noted that the polysilicon doping (and any contact enhancing) should be effected using dopant of the same sign as the buried region to be contacted (P-type for region 1 and N-type for region 2). Thus, the doping step will involve a selective masking and implanting step (one for each dopant type), to be carried out directly after the polysilicon depositing step.

By reason of the dopant diffusivity being higher through polysilicon than through silicon, the dopant concentrations in the regions 5* inside the trenches will show uniformity.

Advantageously in this invention, an enhancement masking step can be omitted if a P-type dopant (not at a very high concentration) is implanted in the whole surface immediately after the polysilicon is deposited, and the P-type dopant can be compensated for by an N-type dopant if masking and implanting at a very high concentration is effected in the N-type buried regions.

Alternatively, a boron deposition or in situ doping may be carried out.

Figure 5E:
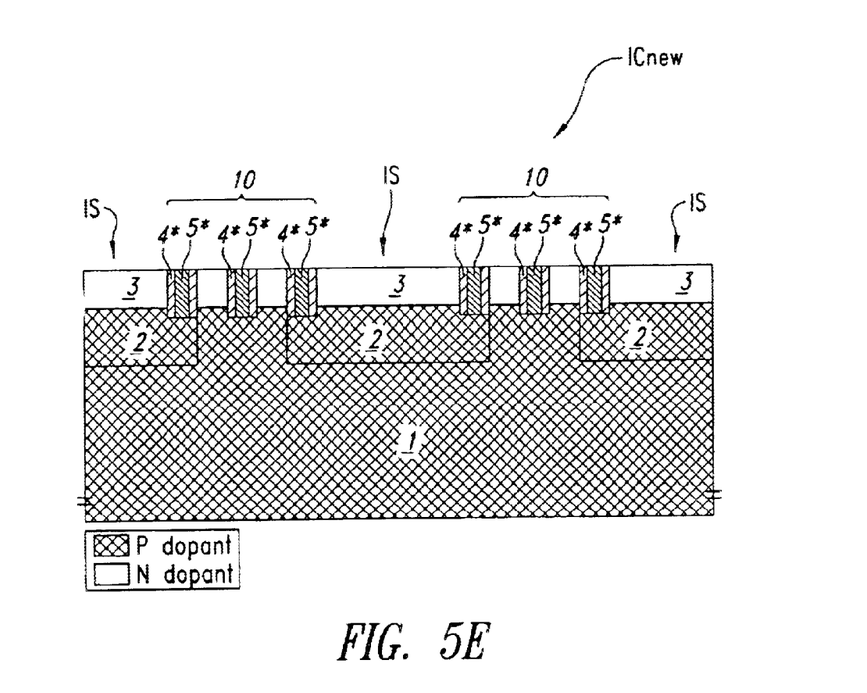

Once electrical contact to the buried region is established, a surface planarizing step, as by chemical etching, is carried out to remove the polysilicon, nitride and oxide layers previously grown to define the trenches, as shown schematically in FIG. 5e.

At this processing stage, the dielectric trenches 4* and associated contact regions 5* to the buried regions will have been defined.

The integrated device fabrication process goes on through standard aspects of the component integration (P-well, N-well, active area, active regions, enhancements, contacts, etc.).

The structure of the integrated device ICnew according to the invention is susceptible of modifications, based on the above process sequence and depending on applicational requirements, a few such modifications being shown in FIGS. 6 to 10.

Figure 6:
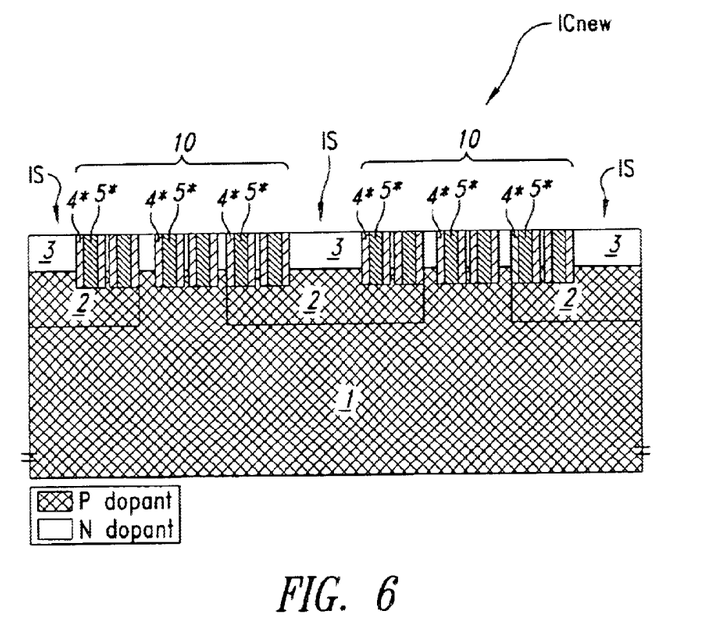
FIG. 6 is a schematic cross-sectional view of another embodiment of an integrated device formed in accordance with the present invention.

In particular, and as shown schematically in FIG. 6, a plurality of trenches may be formed in the P-type (bulk isolation) region 1 and the N-type (buried $N^+$) region, respectively. The contact region between the region 1, 2 and the respective regions 4*, 5* extends over a larger area, thus making for lower contact resistance.

Figure 7:
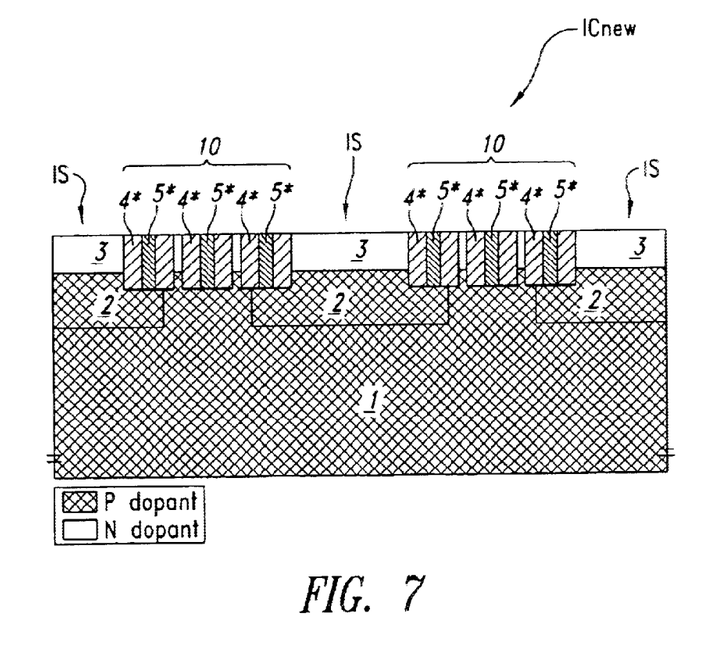
FIG. 7 is a schematic cross-sectional view of another embodiment of an integrated device formed in accordance with the present invention.

Advantageously in this invention, a broader dielectric region may be formed around the conductive material in the trench, as shown schematically in FIG. 7.

In a preferred version of this embodiment, two adjoining trenches may be formed with different apertures and spacings, such that the oxidized regions in the sidewall oxidizing step will join together. In this case, the outward trench should have a smaller aperture than the inward trench, so as to be stopped during the sidewall oxidizing step and unfilled by the conductive material.

Figure 8:
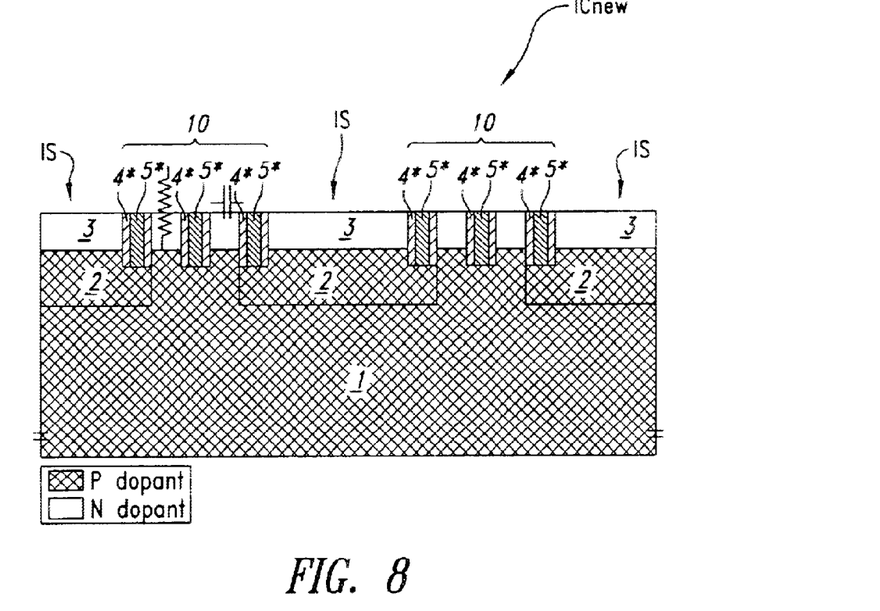
FIG. 8 is a schematic cross-sectional view of another embodiment of an integrated device formed in accordance with the present invention.

As further shown schematically in FIG. 8, the silicon region left over between trenches may be conveniently utilized to integrate active or passive components, such as resistors or capacitors, therein.

Figure 9:
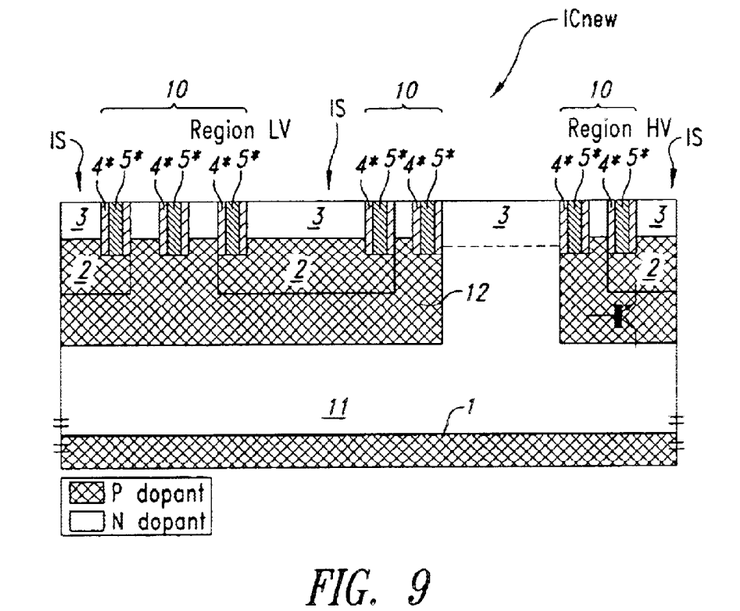
FIG. 9 is a schematic cross-sectional view of another embodiment of an integrated device formed in accordance with the present invention.

Advantageously in this invention, the isolation structure with filled trenches may be used, additionally to improve the isolation of adjoining wells and make the integration area more compact, to contact buried regions, e.g., high- or low-voltage active components, as shown schematically in FIG. 9.

As can be seen in FIG. 9, the filled trench isolation structure of the invention allows here the base and emitter regions of a bipolar component, integrated with VIPower technology, to be contacted. In this case, the conductive regions inside the trench, besides biasing the regions underneath, are current stressed as well.

The areas of and the number of trenches should, therefore, be chosen appropriately to enable the integrated device that they comprise to perform correctly.

Figure 10:
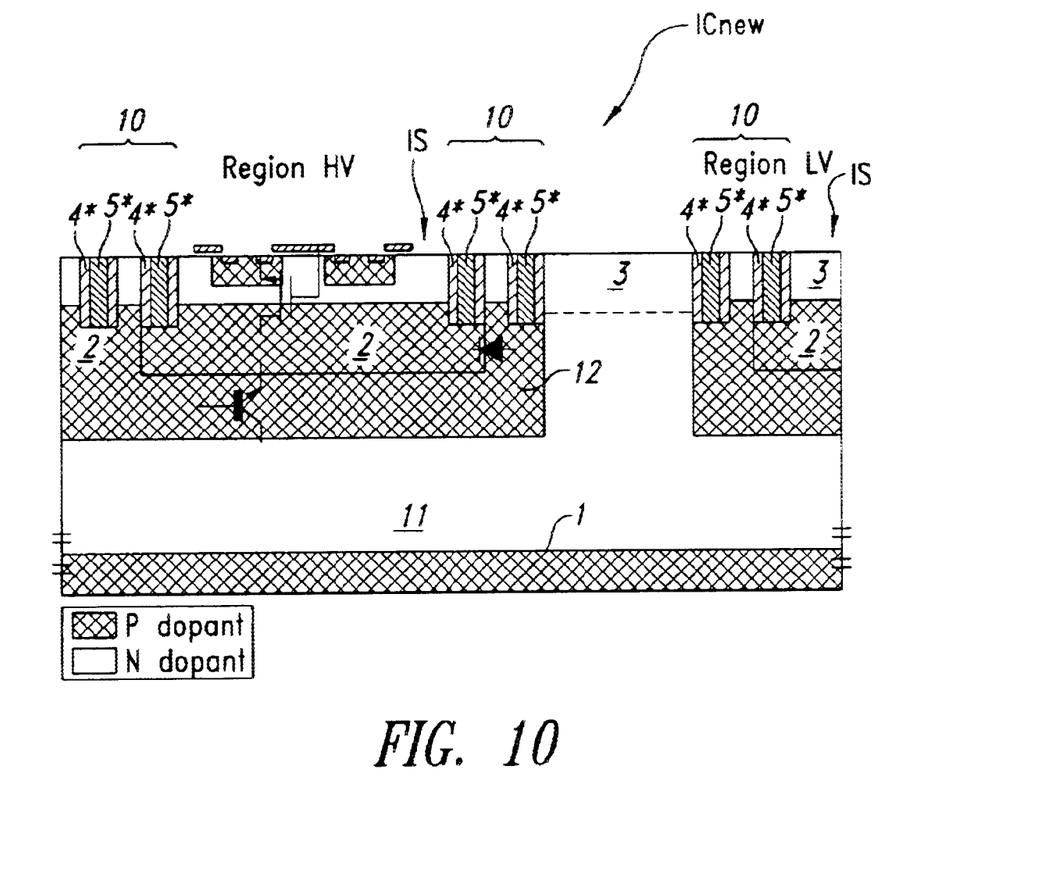
FIG. 10 is a schematic cross-sectional view of another embodiment of an integrated device formed in accordance with the present invention.

Finally, the filled trench isolation structure of the invention allows fairly complex structures to be integrated at a great saving of area over prior structures, as illustrated schematically by FIG. 10—where a vertical cross-section taken through an emitter switching type of device (MOS-cum-bipolar in this example) is shown—and with the disturbance from side parasites of the structure being suppressed by the dielectric regions.

It should be noted that the region between the base and the emitter in FIG. 10 forms a buried diode, which is connected to the surface by the dielectric-bordered contact regions.

To summarize, the integrated device ICnew according to the disclosed embodiment of the invention includes an isolation structure of filled trenches, which at one time provide proper insulation for the wells where the device components are integrated, and for contacting the deep regions of the device, so that the space requirements for the isolation structure and the integrated device as a whole can be reduced.

Also, the provision of such filled trenches is advantageous where the integrated device is to receive some simple modifications, and in that it improves the performance and reliability of the device in different applications.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. An integrated device, comprising: a substrate wherein a buried layer and an epitaxial region have been formed, and an isolation structure adapted to define a plurality of isolation wells for integrating the components of the integrated device therein, said isolation structure comprising plural dielectrically insulated trenches, each trench having an open bottom, and each trench having only a lining of oxide and a filling of a completely conductive material to form a contact region that is in direct contact with one of the substrate and buried layer.

2. The integrated device of claim 1 wherein said dielectric trenches are formed at the edges of the isolation wells in contact with said buried layer.

3. The integrated device of claim 1 wherein said dielectric trenches are formed in intervening areas between adjacent isolation wells in contact with said substrate.

4. The integrated device of claim 2 wherein the plurality of trenches are in contact with said buried layer and are located at each edge of each isolation well.

5. The integrated device of claim 3 wherein each intervening area between adjacent isolation wells includes a plurality of trenches in contact with said substrate.

6. The integrated device of claim 1 wherein said plurality of trenches comprise dielectric regions surrounding the contact regions.

7. The integrated device of claim 1, comprising active or parasitic components integrated in intervening regions between each of the plurality of trenches.

8. The integrated device of claim 1 wherein said isolation structure contacts buried regions of high- or low-voltage active components of the integrated device.

9. An isolation trench structure, comprising:
a substrate having a buried layer and an epitaxial region formed therein;
a plurality of isolation wells formed in the substrate; and
a dielectrically insulated trench formed between each of the isolation wells and located at the edges of the isolation wells, each trench having an open bottom and each trench comprising a central contact region surrounded by insulating dielectric regions, each central contact region formed of electrically conductive material that is in direct contact with the buried layer.

10. The structure of claim 9 wherein the central contact region comprises doped polysilicon material.

11. An isolation trench structure formed in a semiconductor substrate having a buried region, comprising:
an isolation structure formed in the substrate to define a plurality of isolation wells, the isolation structure comprising a plurality of trenches, each trench having an open bottom and sidewalls, and each trench having only a single insulating dielectric material to define a central cavity having an open bottom, and a conductive material filling the central cavity and in contact with one of either the substrate and the buried region to provide a conductive path to the substrate surface.

12. An integrated device, comprising:
a substrate having a buried layer and an epitaxial region formed therein, and an isolation structure adapted to define a plurality of isolation wells for integrating the components of the integrated device therein, the isolation structure comprising plural dielectrically-insulated trenches, each trench having an open bottom and each trench filled with a completely conductive material to form a contact region that is in direct contact with one of the substrate and the buried layer, the conductive material and substrate and buried layer further doped with a doping material of a first conductivity and first concentration, and the buried layer doped with a second dopant of opposite conductivity than the first dopant and at a concentration higher than the concentration of the first dopant to compensate for the first dopant.

13. An isolation trench structure formed in a semiconductor substrate having a buried region, comprising:
an isolation structure formed in the substrate to define a plurality of isolation wells, the isolation structure comprising a plurality of trenches, each trench having an open bottom to define a central cavity and lined with a single insulating dielectric material to define a central cavity and completely conductive material filling the central cavity and in contact with one of either the substrate and the buried region to provide a conductive path to the substrate surface, the conductive material, buried region, and substrate doped with a first-type dopant of a first concentration, and the buried region doped with a second-type dopant at a second concentration to compensate for the first-type dopant.

14. An isolation trench structure, comprising:
a substrate having a buried layer and an epitaxial region formed therein;
a plurality of isolation wells formed in the substrate; and
a dielectrically-insulated trench formed between each of the isolation wells and located at the edges of the isolation wells, each trench having an open bottom and each trench comprising a central contact region surrounded by insulating dielectric regions, each central contact region formed of electrically-conductive material that is in direct contact with the buried layer, the isolation wells and conductive material doped with a first-type dopant at a first concentration and the isolation wells doped with a second-type dopant of a second concentration that is higher than the first concentration of the first-type dopant.

* * * * *